US006707122B1

United States Patent
Hines et al.

(10) Patent No.: US 6,707,122 B1
(45) Date of Patent: Mar. 16, 2004

(54) EXTRAORDINARY MAGNETORESISTANCE AT ROOM TEMPERATURE IN INHOMOGENEOUS NARROW-GAP SEMICONDUCTORS

(75) Inventors: Daniel R. Hines, Lawrenceville, NJ (US); Stuart A. Solin, Princeton Jct., NJ (US); Tineke Thio, Princeton, NJ (US); Tao Zhou, Plainsboro, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 0 days.

(21) Appl. No.: 09/697,661

(22) Filed: Oct. 26, 2000

Related U.S. Application Data
(60) Provisional application No. 60/178,431, filed on Jan. 27, 2000, and provisional application No. 60/167,965, filed on Nov. 30, 1999.

(51) Int. Cl.[7] .......................... H01L 27/14; H01L 29/82; B32B 15/04
(52) U.S. Cl. ....................... 257/421; 257/414; 257/422; 257/427; 428/627; 428/679; 428/692
(58) Field of Search ................................. 257/414, 421, 257/422, 427; 428/692, 611, 627, 679; 324/252, 257

(56) References Cited

U.S. PATENT DOCUMENTS

| | | | | |
|---|---|---|---|---|
| 5,965,283 A | * | 10/1999 | Solin et al. | 428/692 |
| 6,024,885 A | * | 2/2000 | Pendharkar et al. | 216/22 |
| 6,353,317 B1 | * | 3/2002 | Green et al. | 324/252 |

OTHER PUBLICATIONS

R.S. Popovic, Hall Effect Device (Adan Hilger, Bristol, 1991).*
Brug, J.A. et al., "Magnetic Recording Head Materials", MRS Bulletin, pp. 23–27, Sep. 1996.
Heremans, J.P., "Magnetic Field Sensors for Magnetic Position Sensing in Automotive Applicators", Mat. Res. Soc. Symp. Proc., vol. 475, pp. 63–74, 1997.
Kuze, N. et al., "MBE Research and Production of Hall Sensors", MBE Review, III–Vs Review, vol. 10, No. 1, pp. 28–32, 1997.
Levy, P.M., "Giant Magnetoresistance in Magnetic Layered and Granular Materials", Solid State Physics, vol. 47, pp. 367–463, 1994.

(List continued on next page.)

Primary Examiner—Tom Thomas
Assistant Examiner—Donghee Kang
(74) Attorney, Agent, or Firm—Scully, Scott, Murphy & Presser

(57) ABSTRACT

A symmetric van der Pauw disk of homogeneous nonmagnetic semiconductor material, such as indium antimonide, with an embedded concentric conducting material inhomogeneity, such as gold, exhits room temperature geometric extraordinary magnetoresistance (EMR) as high as 100%, 9,100% and 750,000% at magnetic fields of 0.05, 0.25 and 4.0 Tesla, respectively. Moreover, for inhomogeneities of sufficiently large cross section relative to that of the surrounding semiconductor material, the resistance of the disk is field-independent up to an onset field above which the resistance increases rapidly. These results can be understood in terms of the field-dependent deflection of current around the inhomogeneity. The EMR exhibited by a composite van der Pauw sensor comprising a semiconductor having an embedded metallic inhomogeneity or internal shunt can be obtained from electrically equivalent externally shunted structures, such as rectangular plates including an external conductive shunt element which is simple to manufacture in the mesoscopic sizes required for important magnetic sensor applications. For example, a bilinear conformal mapping is used to transform a circular composite van der Pauw disk sensor having an embedded conducting inhomogeneity into a corresponding externally shunted rectangular plate structure. The result is an EMR sensor that can be realized in very simple structures which facilitate fabrication in mesoscopic dimensions important for many magnetic sensor applications.

45 Claims, 9 Drawing Sheets

OTHER PUBLICATIONS

Egelhoff, W.F. et al., "Magnetoresistance Values Exceeding 21% in Symmetric Spin Valves", *Journal of Applied Physics*, 78 (1) pp. 273–277, Jul. 1995.

Rao, C.N.R. et al., "Colossal Magnetoresistance, Charge Ordering and Related Properties of Manganese Oxides", *World Scientific*, Singapore, 1998.

Jin, S. et al., "Colossal Magnetoresistance in La–Ca–Mn–O Ferromagnetic Thin Films (invited)", *Journal of Applied Physics*, 76 (10) pp. 6929–6933, Nov. 1994.

XU, R. et al., "Large Magnetoresistance in Non–Magnetic Silver Chalcogenides", *Nature*, vol. 390, pp. 57–60, Nov. 1997.

Thio, T. et al., "Giant Magnetoresistance Enhancement in Inhomogeneous Semiconductors", *Applied Physics Letters*, vol. 72, No. 26, pp. 3497–4107, Jun. 1998.

Thio, T. et al., "Giant Magnetoresistance in Zero–Band–Gap $Hg_{1-x}Cd_{t-x}Te$", *Physical Review B*, pp. 12,239–12,244, May 1998.

Popovic, R.S., "Hall Devices. General Characteristics", *Hall Effect Devices*, pp. 157–165 & pp. 237–240, 1991.

Zawadzki, W., "Electron Transport Phenomena in Small–Gap Semiconductors", *Adv. Phys.*, vol. 23, pp. 435–522, 1974.

Herring, C., "Effect of Random Inhomogeneities in Electrical and Galvanomagnetic Measurements", *Journal of Applied Physics*, vol. 31, No. 11, pp. 1939–1953, Nov. 1960.

Weiss, H. et al., "Indiumantimonid Mit Gerichtet Eingebauten, Elektrisch Gut Leitenden Einschlussen: Systems InSb–NiSb", *Zeitschrift fur Physik* 176, pp. 399–408, 1963.

Parker, S.D. et al., "Observation and Control of the Amphoteric Behaviour of Si–Doped InSb Grown on GaAs By MBE", *Semicond. Sci. Technol.*, vol. 4, pp. 663–676, 1989.

Wolfe, C.M. et al., "High Apparent Mobility in Inhomogeneous Semiconductors", *Journal of Electrochem. Soc.*, pp. 250–255, Feb. 1972.

Parkin, S.S.P., "Coming of Age of Magnetic Multilayers: Giant Magnetoresistance Field Sensors and Magnetic Tunnel Junction Memory Elements", *Bull Am. Phys. Soc*, vol. 44, No. 1, part II, pp. 1555–1556, 1999.

Solin, S.A. et al., "Self–Biasing Nonmagnetic Giant Magnetoresistance Sensor", *Applied Physics Letters*, vol. 69, No. 26, pp. 4105–4107, 1996.

O'Grady, K. et al., "Whiter Magnetic Recording", *Journal of Magnetism and Magnetic Materials*, pp. 886–891, 1998.

Thio, T. et al., "Giant Magnetoresistance in $Hs_{1x}Cd_{t-x}Te$ and Applicatioins for High Density Magnetic Recording", *Journal of Crystal Growth*, pp. 1293–1296, 1998.

Chien, C–L, "Standing Out From the Giants and Colossi", *Physics World*, p. 24, Nov. 2000.

* cited by examiner

EXTRAORDINARY MAGNETORESISTANCE AT ROOM TEMPERATURE IN INHOMOGENEOUS NARROW-GAP SEMICONDUCTORS

CROSS-REFERENCE TO RELATED APPLICATION

This application claims priority on U.S. Provisional Patent Application Serial No. 60/167,965, filed on Nov. 30, 1999 and U.S. Provisional Patent Application Serial No. 60/178,431, filed on Jan. 27, 2000. The contents of these provisional applications are hereby incorporated by reference.

FIELD OF THE INVENTION

The present invention relates to magnetoresistance sensors and particularly to sensors exhibiting extraordinary magnetoresistance greater than 100% at 500 Gauss at room temperature in inhomogeneous narrow-gap semiconductors.

BACKGROUND OF THE INVENTION

Various types of sensors exhibiting magnetoresistive characteristics are known and implemented in systems, particularly for reading of information signals recorded in magnetic media such as tapes, drums and diskettes. Sensors are also used to monitor shaft position and/or rotation and for proximity switches.

These sensors typically comprise a block made of a ferromagnetic alloy exhibiting high magnetoresistance. A recording medium, for example, passing in close proximity to such a sensor causes variations in the magnetic field at the point of the read head and hence variations of the electrical resistance of the magnetoresistive sensors.

It has recently been described in U.S. Pat. No. 5,965,283 entitled "GMR Enhancement in Inhomogeneous Semiconductors for use in Magnetoresistance Sensors" that embedding a conducting material in a matrix of high carrier mobility semiconductor material will increase the magnetoresistance of the combined semiconductor material with embedded conducting material.

Magnetoresistive sensors are critical components in several important technologies including high-density information storage as described, for example, in an article by J. A. Brug et al., entitled "Magnetic recording head materials," in MRS Bulletin, Vol. 21, pages 23–27, 1996. Another important technology is position/speed monitoring in mechanical devices, such as described in an article by J. P. Heremans, entitled "Magnetic Field Sensors for Magnetic Position Sensing in Automotive Applications," in Mat. Res. Soc. Symp. Proc., Vol. 475, pages 63–74, 1997 and in an article by N. Kuze et al. in III-V Review, vol. 10, 28–31 (1997). The technological impact of such sensors is currently constrained by the magnitude of their room temperature (300 K) magnetoresistance (MR). Efforts to improve their room temperature response are focused on two classes of magnetic materials, artificially layered metals, like those described by P. M. Levy in an article entitled "Giant Magnetoresistance in Magnetic Layered and Granular Materials" in Solid States Physics, vol. 47, pages 367–462 (1994), which exhibit Giant MR (GMR) (see, W. F. Egelhoff et al., "Magnetoresistance values exceeding 21% in symmetric spin valves," Journal of Applied Physics, vol. 78, pages 273–277 (1995)) and the manganite perovskites as described by C. N. R. Rao et al., in a book entitled "Colossal Magnetoresistance, Charge Ordering and Related Properties of Manganese Oxides" World Scientific, Singapore (1998), which show Colossal MR (CMR) (see, also, S. Jin et al., "Colossal magnetoresistance in La-Ca-Mn-O ferromagnetic thin films," Journal of Applied Physics, Vol 76, pages 6929–6933 (1994)). CMR has also been reported for non-magnetic silver chalcogenide semiconductors in an article by R. Xu et al., entitled "Large magnetoresistance in non-magnetic silver chalcogenides", Nature, vol. 390, pages 57–60 (1997).

In accordance with the teachings of the present invention, a composite of non-magnetic InSb, a high mobility, narrow-gap semiconductor and metal, exhibits room temperature MR orders of magnitude larger than that obtained to date with other materials. Although InSb exhibits moderate MR in the unpatterned state, embedded metallic inhomogeneities engender room temperature MR's as high as 100%, 9,000% and 750,000% at fields of 0.05, 0.25 and 4.0T, respectively. This Extraordinary MR (EMR) occurs because at H=0 the conducting inhomogeneity is a short circuit, as expected, but at high field it acts, counter-intuitively, as an open circuit. See, Solin et al., Science, vol. 289, 1530 (2000) and Thio et al., "Giant Magnetoresistance Enhancement in Inhomogeneous Semiconductors," Applied Physics Letters, Vol. 72, pages 3497–3499 (1998).

In contrast to the negative MR observed in layered metals or manganite perovskites, the MR on a non-magnetic semiconductor is positive, see T. Thio, et al., "Giant magnetoresistance in zero-bandgap $Hg_{1-x}Cd_xTe$," Physical Review B, vol. 57, no. 19, pages 12239–12244 (1998), and comprises a physical and a geometric contribution. See H. H. Wieder, Hall Generators and Magnetoresistors, Pion Ltd., London (1971) and R. S. Popovic, Hall effect devices, Adam Hilger, Bristol (1991). The physical MR results from the orbital motion of the charge carriers caused by the Lorentz force. The physical MR is determined by material parameters such as the carrier mobility and density (and their magnetic field dependences). The geometric MR depends on the shape of the sample and the placement of electrical contacts and increases quadratically with mobility and field at low field. Thus high mobility narrow-gap semiconductors, for example, as described in W. Zawadzki, "Electron transport phenomena in small-gap semiconductors," Adv. Phys., vol. 23, pages 435–522 (1974), such as InSb and $Hg_{1-x}Cd_xTe$ (where x is preferably approximately 0.1), are attractive proving grounds for geometric effects. It is also well known that inhomogeneities can enhance the MR of a material, as described by C. Herring, "Effect of random inhomogeneities on electrical and galvanomagnetic measurements," Journal of Applied Physics, vol. 31, pages 1939–1953 (1960) and A. Y. Shik, "Electronic Properties of Inhomogeneous Semiconductors" Gordon and Breach, Amsterdam (1995), but the mechanism and/or the geometry differed from those of the present invention and yielded room temperature MR values orders of magnitude lower than the values achieved when practicing the present invention.

SUMMARY OF THE INVENTION

In accordance with the teachings of the present invention, the room temperature magnetoresistance of a semiconductor can be enhanced greatly in a van der Pauw disk geometry with an embedded concentric metallic inhomogeneity. Similar enhancement is achieved when embedding inhomogeneities in semiconductors having shapes other than that of a disk, such as a bar geometry or thin film. Also, the embedded inhomogeneity need not be concentrically located within the disk (centered), but may be off-center. Moreover, either or both of the van der Pauw plate and embedded inhomogeneity may be other than disk shaped. The van der Pauw plate is a closed surface. The inhomogeneity can be of an arbitrary shape.

Adjusting the ratio of the radius of an embedded cylindrical inhomogeneity to the radius of the van der Pauw disk varies the magnetoresistance of the disk as a function of the ratio. Optimizing the ratio results in the disk sensor exhibiting extraordinary magnetoresistance at room temperature. Similarly, optimizing the ratio of the area of an embedded inhomogeneity to the area of the van der Pauw plate in the case of a non-cylindrical inhomogeneity and a non-disk-shaped plate results in a sensor exhibiting extraordinary magnetoresistance at room temperature.

The present design exhibits very high thermal stability. The design also provides the potential to be manufactured at a much lower unit cost than conventional sensors and the capability of operating at speeds of up to 1,000 times higher than sensors fabricated from magnetic materials.

The higher operating speed achievable using the present design will enable industry to build a magnetic disk drive that is capable of storing a Terabit or 1,000 Gigabits of data per square inch.

Another aspect of the present invention takes into consideration that fabricating cylindrical apertures in a van der Pauw disk and fabricating cylindrical inhomogeneities, particularly at mesoscopic size scale, are difficult tasks. Accordingly, a technique is described which maps the cylindrical plate of the van der Pauw disk with an internal cylindrical inhomogeneity into an electrically equivalent rectangular plate with an external rectangular inhomogeneity or shunt thereby enabling fabrication of simpler rectangular or polygon shaped components in order to make an extraordinary magnetoresistance sensor. The mapping technique is applicable for converting any generally sensor design into a polygonal shaped sensor design.

A principal object of the present invention is the provision of a magnetoresistance sensor comprising a semiconductor material containing a conductive inhomogeneity where the dimensions of the inhomogeneity are selected to optimize the magnetoresistance of the sensor.

Another object of the present invention is the provision of a mapping technique to map the shape of the semiconductor material and embedded conducting inhomogeneity of an EMR sensor into a polygon, and preferably a rectangular shape with an external conducting inhomogeneity or shunt, dimensioned to facilitate fabrication of the EMR sensor.

Further and still other objects of the invention will be more clearly understood when the following description is read in conjunction with the accompanying drawings.

DETAILED DESCRIPTION

Figure 1A:
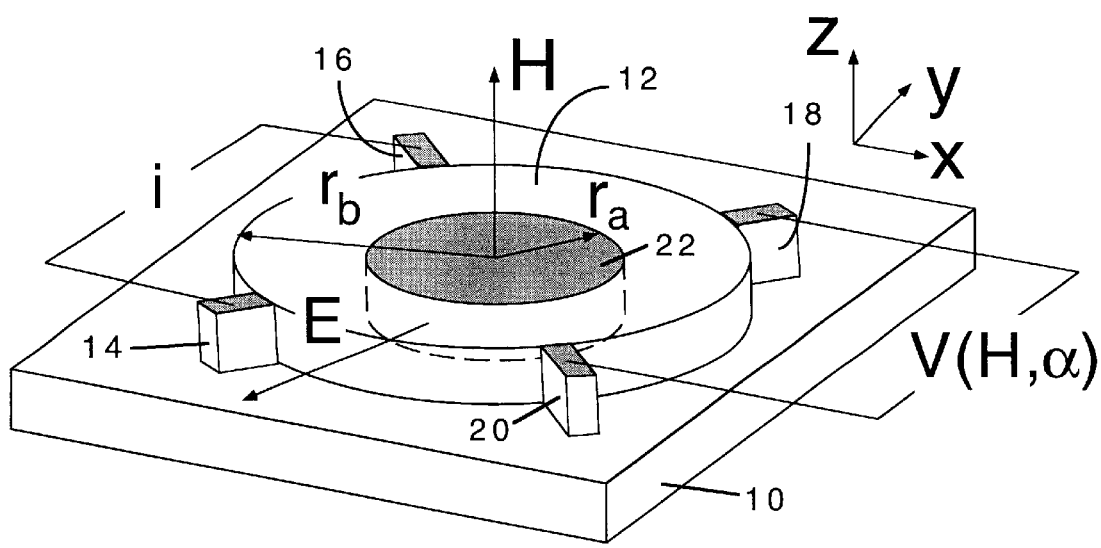
FIG. 1A is a schematic diagram of cylindrical inhomogeneity embedded in a van der Pauw disk.

Referring now to the figures and to FIG. 1A, in particular, there is shown schematically a van der Pauw sensor. The sensor shown includes a semiconductor substrate 10.

Preferably, the substrate is GaAs. Disposed on the substrate is a disk of semiconductor material 12 with four equi-spaced tabs 14, 16, 18 and 20 extending radially from the circumferential edge of disk 12, each tab having an electrically conducting contact pad thereon. Tabs 14 and 16 are current electrodes and tabs 18 and 20 are voltage electrodes.

The requirements for the semiconductor material are mainly that its carrier mobility is very high (greater than 10,000 cm$^2$/Vsec) and that its resistivity varies slowly with temperature at approximately room temperature. Narrow-bandgap semiconductors can exhibit mobilities in excess of 10$^4$ cm$^2$/Vs, even at room temperature, and the mobility does not decrease drastically with doping, which is required to achieve a small dR/dT. Examples of such high-mobility semiconductors are indium antimonide, indium arsenide, mercury cadmium telluride, mercury zinc telluride, and lead tin telluride.

A cylinder of conducting material 22 is centrally concentrically disposed within the disk 12 to form a conducting inhomogeneity in the disk 12.

The conductivity of the inhomogeneity must be significantly higher than that of the semiconductor at all relevant magnetic fields, and it must make good ohmic contact to the semiconductor. Noble metals such as silver or gold, and their alloys with other metals as well as copper, nickel and chromium and their alloys with other metals may be used for the material of the embedded inhomogeneities; good ohmic contact may be achieved with stacks of thin layers of various metals as is known in the art. Finally, the size of the EMR depends on the thickness of the inhomogeneity, where the thickness of the inhomogeneity is the range between approximately 300 Å and 1.2 times the thickness of the semiconductor; it is therefore possible to control the size of the final EMR by controlling the geometric configuration and materials properties of both the semiconductor and the metallic inhomogeneities.

A device of the type shown in FIG. 1A was fabricated with MOVPE (metal organic vapor phase epitaxy) grown epilayers of Te-doped n-type InSb. A buffer layer of 200 nm undoped InSb was grown on a 4-inch semi-insulating GaAs substrate (resistivity greater than 1×10$^{17}$ Ω-cm). A 1.3 μm active layer of InSb (n=2.6×10$^{16}$ cm$^{-3}$ and μ=45,500 cm$^2$/Vs), where n is the carrier concentration and μ is mobility, was deposited on the buffer layer and capped with a 50 nm InSb contacting layer (n~1.5×10$^{17}$ cm$^{-3}$). The resulting device was passivated by a 200 nm layer of Si$_3$N$_4$. Due to lattice mismatch at the GaAs/InSb interface, the in-plane 300K (room temperature) mobility of InSb films drops rapidly with thickness below approximately 1 μm (reaching a value of 1000 cm$^2$/Vs at 150 nm). Thus, the InSb buffer does not represent a parallel conduction channel. The heavily doped thin cap layer has low mobility and is partially depleted due to band-bending at the InSb/Si$_3$N$_4$ interface. Hence, this layer likewise does not contribute to parallel conduction. The wafers were photolithographically patterned into chips bearing mesas as shown in FIG. 1A. The circular mesas 12 (diameter=1 mm) contain four contact pads 14, 16, 18 and 20 and a concentric hole with smooth side-walls (average wall angle of approximately 19° tapered outward from bottom to top), prepared by reactive ion etching. Subsequently, the hole and mesa contact pads were simultaneously metallized with a Ti/Pt/Au stack with Au as the dominant component. Final contacting was achieved by wire-bonding.

Extraordinary magnetoresistance (EMR) was measured with the modified van der Pauw geometry shown in FIG. 1A. In that geometry a concentric cylindrical metallic conducting inhomogeneity of radius $r_a$ and conductivity $\sigma_0 \gg \sigma$, where $\sigma_0$ and $\sigma$ are the conductivity of the conductor 22 and semiconductor 12, respectively, is embedded in a van der Pauw disk having a radius $r_b$ of homogeneous semiconductor 12. This construct was first employed by Wolfe et al. in Journal of Electrochem. Soc.: Solid-State Science and Technology, vol. 119, pages 250–255 (1972)) to account theoretically for geometrically induced mobility and Hall coefficient anomalies exhibited by inhomogeneous semiconductors. Following the teaching of Wolfe et al. two parameters are defined, $\alpha = r_a/r_b$ and $s = \sigma_0/\sigma$. Then, for fixed current, i, the effective 4-contact resistance of the composite disk is R(H,T,α,s)=V(H,T,α,s)/i. Where H is the magnetic field in a plane perpendicular to the flat end of the cylindrical inhomogeneity, T is temperature, and α and s are defined as above. For measurements at room temperature with Au inhomogeneities in InSb, the T and s variables can be removed and the EMR is defined as $[\Delta R(H,\alpha)]/R_0^\alpha = [R(H,\alpha) - R_0^\alpha]/R_0^\alpha$ where now $R_0^\alpha = R(0,\alpha)$. The standard van der Pauw geometry corresponds to the case when α=0.

Figure 1B:
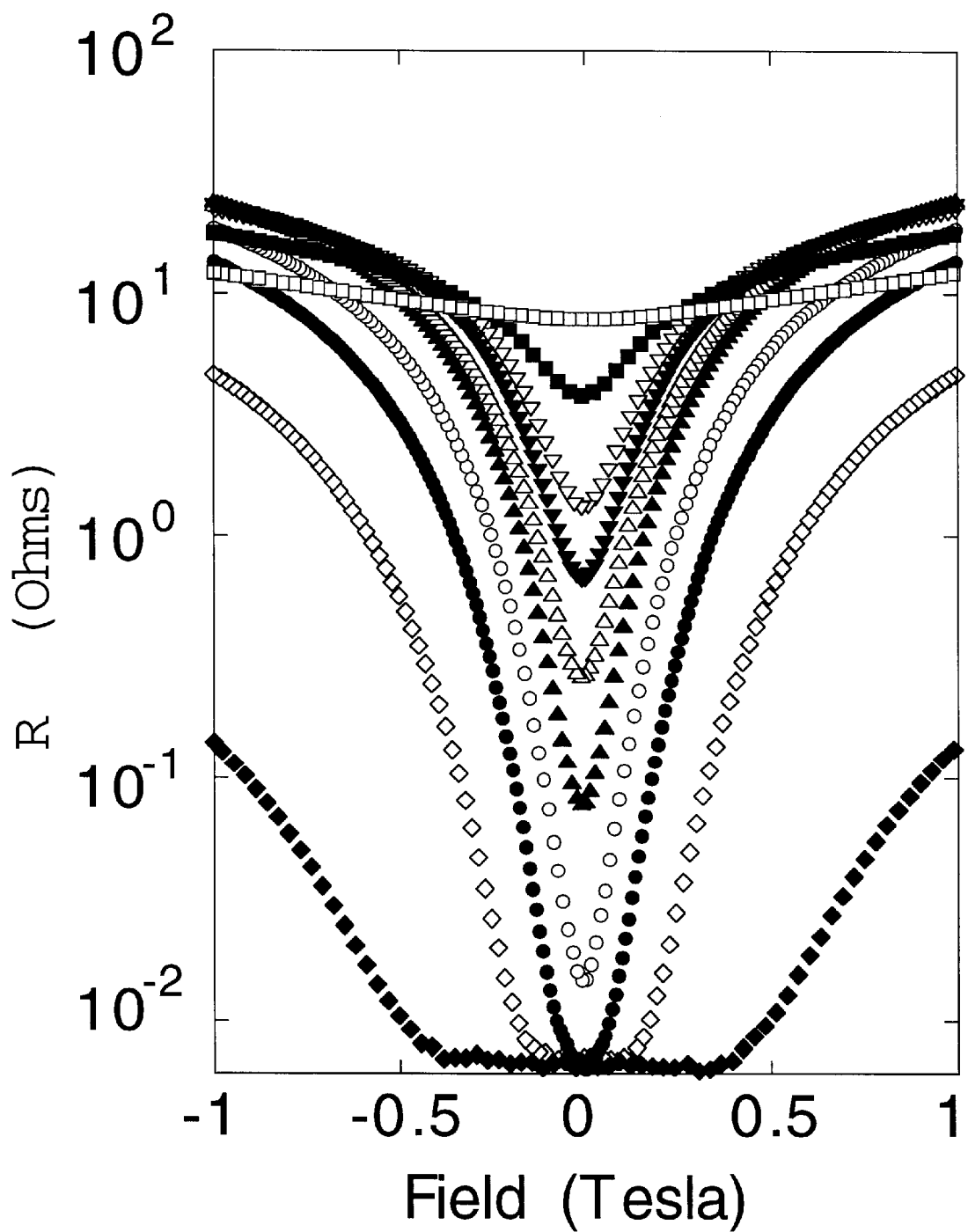
FIG. 1B is a graphical representation of the room temperature resistance of the composite van der Pauw disk in FIG. 1A as a function of magnitude field for different values of $\alpha$, where $\alpha$ is the ratio of the radius of the embedded inhomogeneity to the radius of the van der Pauw disk.

FIG. 1B is a semi-log graph of R(H,α) for 0≦H≦1 T and for values of a varying from 0 to 15/16. The symbols in the graph correspond to

16α=0-□, 6-■, 8▽, 9-▼, 10-Δ, 11-▲, 12-○, 13-●, 14-◊, 15-♦,

As expected, the zero-field resistance drops monotonically with increasing α as a result of the increasing conductance of the inhomogeneity. However, because the conductivity of the Au inhomogeneity is finite, R(0,α) begins to saturate at large α, e.g. α greater than approximately 13/16. Care was taken to verify that this saturation is real and not an artifact of the measurement apparatus. When saturation occurs, the resistance becomes field independent up to a critical field above which the resistance rises rapidly with increasing field. Thus, for sufficiently large α, the device acts like a magnetic "diode" or switch.

Figure 1C:
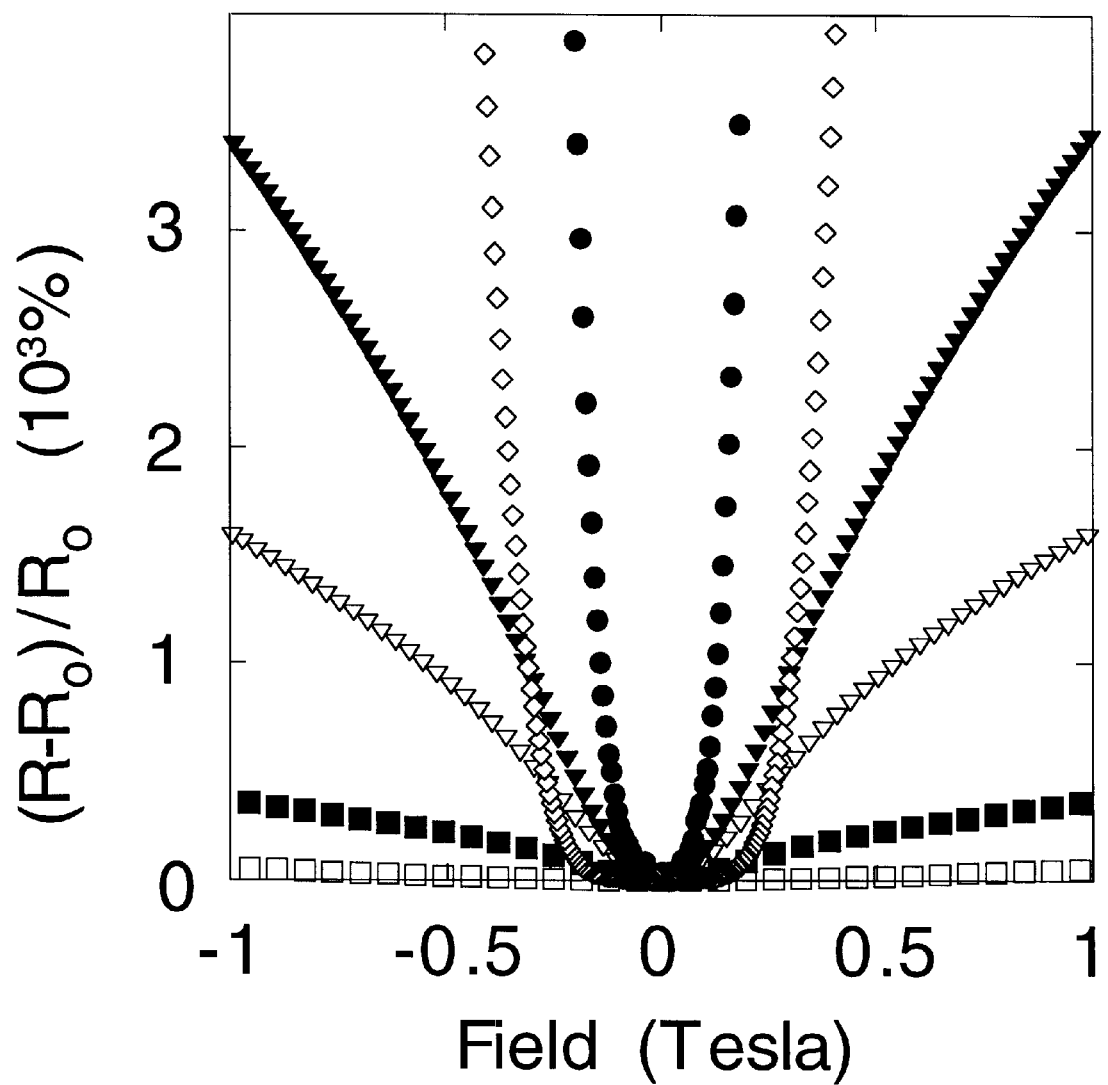
FIG. 1C is a graphical representation of the room temperature magnetoresistance of the composite van der Pauw disk in FIG. 1A as a function of magnetic field for different values of $\alpha$.
Figure 2:
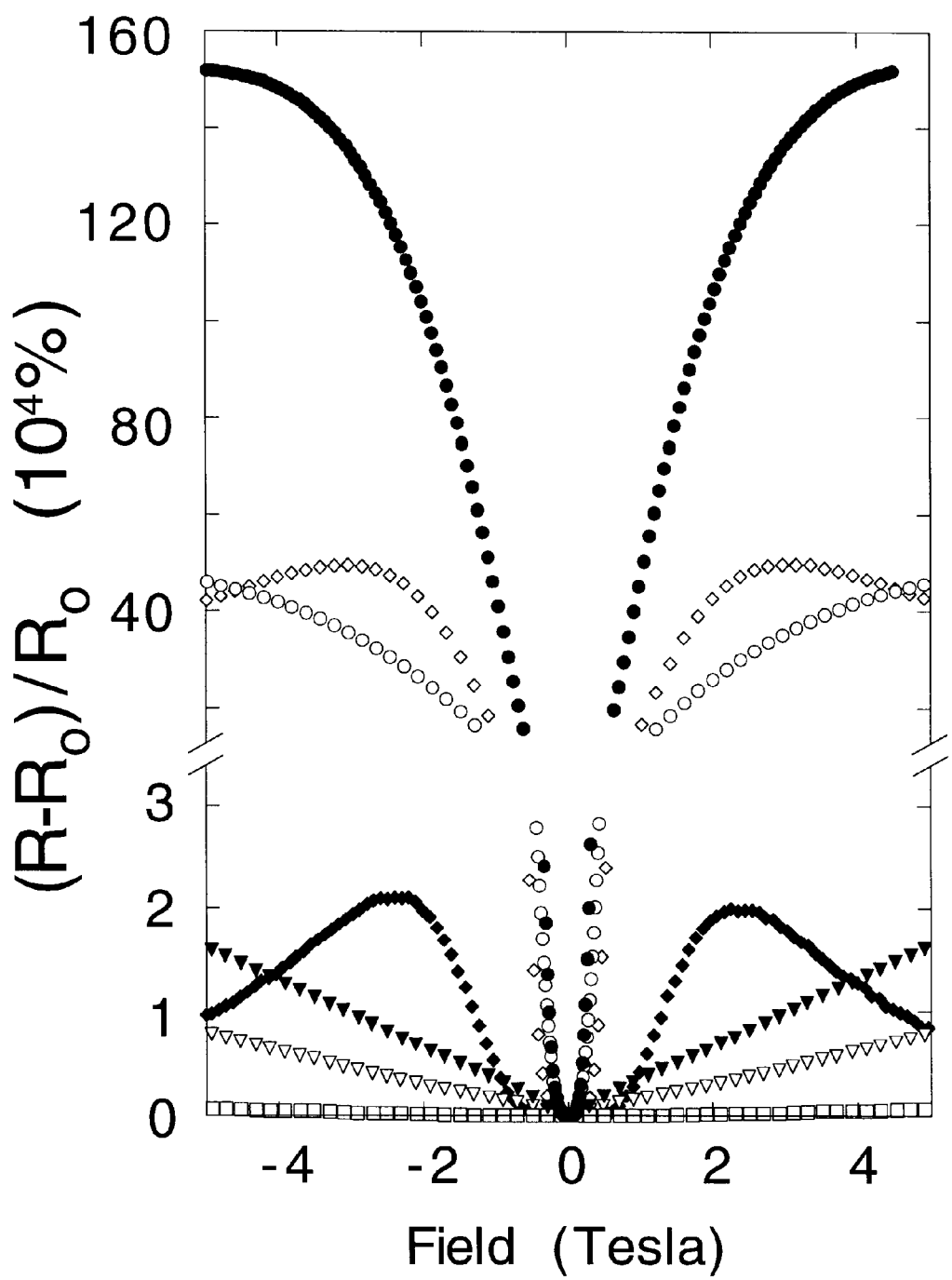
FIG. 2 is a graphical representation of the room temperature high magnetoresistance of the composite van der Pauw disk in FIG. 1A as a function of magnetic field for different values of $\alpha$.
Figure 3:
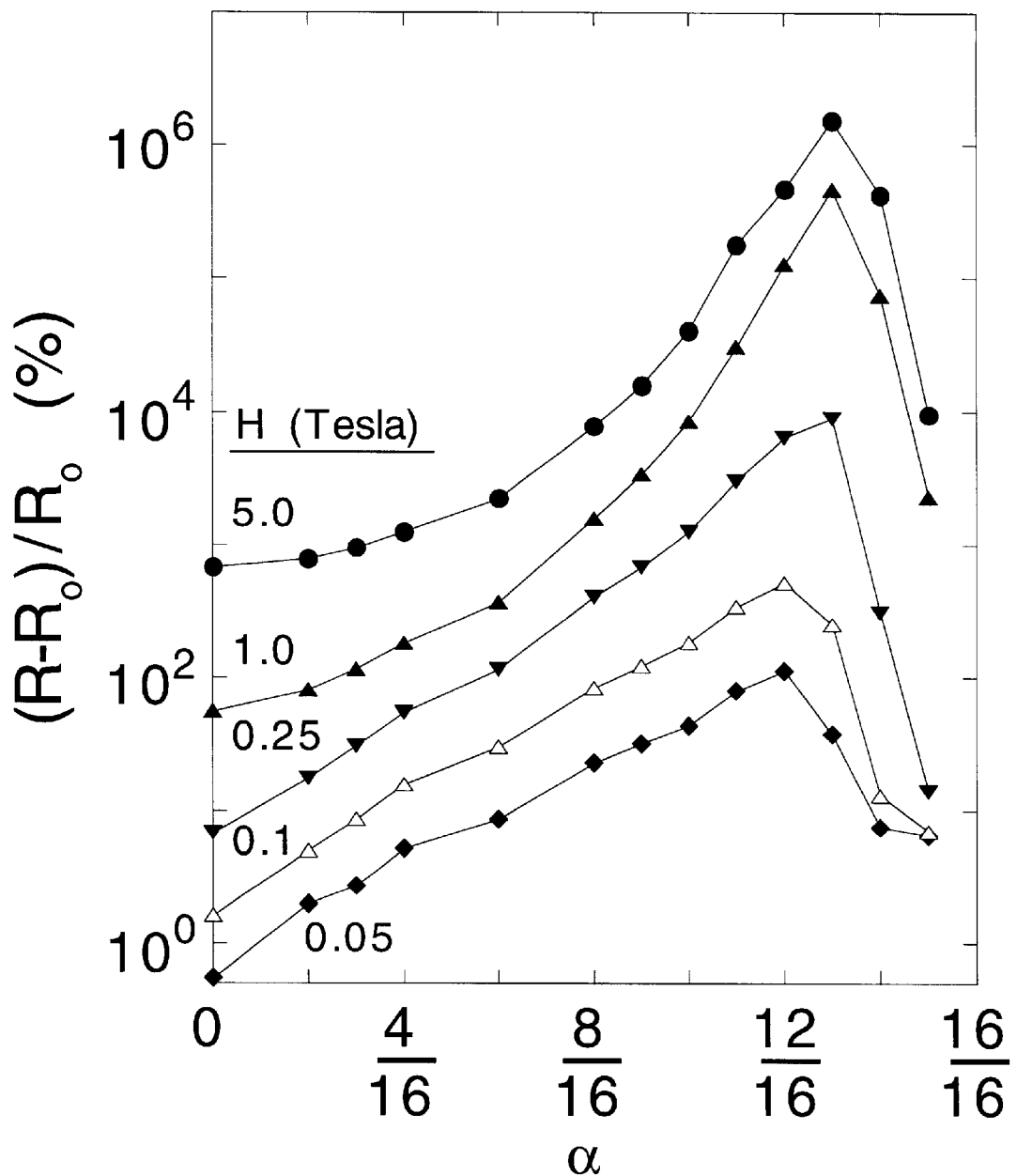
FIG. 3 is a graphical representation of the room temperature high magnetoresistance of the composite van der Pauw disk in FIG. 1A as a function of $\alpha$ at different values of magnetic field (H)

It is apparent from FIG. 1B that the magnetoresistance of the modified van der Pauw disk will be very large. This is quantitatively validated in FIGS. 1C and 2 which show the EMR of the composite disk up to fields of 1T and 5T, respectively. A prominent feature of the EMR is that for fields above approximately 2 T the magnetoresistance either saturates or, for α=14/16 and 15/16, exhibits a maximum. It may be seen from FIG. 2 that for values of α=13/16 the EMR evolves from a quadratic to a quasi-linear field dependence. The EMR also grows monotonically with α up to α=13/16 above which it precipitously decreases. This latter behavior is even more evident from FIG. 3 which shows the EMR dependence on α for a family of fixed magnetic fields. However, the most notable feature of the graph of FIG. 3 is the magnitude of the magnetoresistance. For α=12/16 the EMR is 113% at 0.05T while for α=13/16 it is 9100% at 0.25T and 750,000% at 4T. (See also FIG. 2.) For comparison it should be noted that layered metals exhibit a GMR of approximately 22% at room temperature and 0.005T or giant magnetotunneling of approximately 42% at room temperature and 0.0003T while the manganite perovskites show a CMR of 127,000% at 77K and 6T but only 39% at room temperature and 1.75T and the chalcogenide semiconductors yield a CMR of 200% at 300K and 5.5T. See, Egelhoff et al, Rao et al, Jin et al, Xu et al, supra and S. P. S. Parkin, Coming of age of magnetic multilayers: giant magnetoresistance field sensors and magnetic tunnel junction memory elements. *Bull Am. Phys. Soc.* 44, 1555–1556 (1999).

The principles which underlie the achievement of such high values of EMR at room temperature will now be described. Consider the composite van der Pauw geometry shown in FIG. 1A. The components of the magnetoconductivity tensor σ(H) for the semiconductor are $\sigma_{xx}(\beta) = \sigma_{yy}(\beta) = \sigma/[1+\beta^2]$, $\sigma_{zz}(\beta) = \sigma$, and $\sigma_{xy}(\beta) = -\sigma\beta/[1+\beta^2] = -\sigma_{yx}(\beta)$ with $\beta = \mu H$ and all others being zero. If the electric field on the vertical surface of the inhomogeneity is $\vec{E} = E_x\hat{x} + E_y\hat{y}$, the current density is written as $\vec{J} = \underline{\sigma(H)}\vec{E}$. The electric field is everywhere approximately normal to the equipotential surface of a highly conducting inhomogeneity. At H=0, $\underline{\sigma(H)}$ is diagonal so $\vec{J} = \sigma\vec{E}$ and the current flows into the inhomogeneity which acts as a short circuit. At high H (β>1), the off-diagonal components of $\underline{\sigma(H)}$ dominate so $\vec{J} = (\sigma/\beta)[E_y\hat{x} - E_y\hat{y}]$ and $\vec{J} \perp \vec{E}$. Equivalently, the Hall angle between the electric field and the current density approaches 90°, and the current becomes approximately tangent to, i.e. deflected around, the inhomogeneity. Thus, the inhomogeneity acts as an open circuit. The transition of the inhomogeneity from a short circuit at low H to an open circuit at high H results in a geometric enhancement of the magnetoresistance of the semiconductor even if its resistivity (conductivity) is field independent (i.e. the physical magnetoresistance is zero). The EMR increases with a because $R_0^\alpha$ decreases. However, when a becomes sufficiently large so that the low-field current flows mostly through the inhomogeneity, the magnetoresistance will be that of the inhomogeneity itself, which for Au is negligibly small. Then an appreciable magnetoresistance is only observed when H is sufficient to deflect the current from the inhomogeneity such that the conductance through the metallic inhomogeneity is smaller than the conductance through the semiconductor annulus of thickness $r_b - r_a$.

The low-field EMR is approximately quadratic for all values of α=13/16 (see FIGS. 1B, 1C and 2) as noted above and can thus be quantitatively accounted for with the form $[\Delta R(H,\alpha)]/R_0^\alpha = \{\mu_{app}^\alpha (H - H_0)\}^2$ where $\mu_{app}$ is the apparent mobility and $H_0$ is a zero-field offset. The apparent mobilities obtained from matches to the data using this form are larger than the actual mobility of the semiconductor. For α=13/16, for example, $\mu_{app}^{13/16}/\mu = 22.3$. The linear response and roll off of the EMR at higher fields can also be quantitatively accounted for using an augmented Wolfe model which was employed previously to explain the much smaller magnetoresistance that results from natural microscopic inhomogeneities in $Hg_{1-x}Cd_xTe$, x=0.1.

A comparison of the properties of EMR sensors with other magnetic sensors in current use will now be described.

Conventional metallic multilayer (spin-valve) read-heads may not provide sufficient sensitivity when scaled to sizes of 300 Å×2100 Å corresponding to the superparamagnetic limit for modern media of 100 Gb/in$^2$, due to demagnetization and other magnetic effects. Composite non-magnetic semiconductors with EMR greater than approximately 100% at the relevant field of 0.05 T are not thus limited. Moreover, their response time can be approximated by the inverse of the plasmon frequency, yielding a value in the sub-picosecond range. This is significantly faster than the $10^{-9}$ to $10^{-10}$ sec switching times of layered metallic sensors that are limited by magnetization dynamics. Additionally, doping into the saturation region reduces the thermal coefficient of resistance of semiconductor sensors to values as low as 0.09% K, well below that obtained to date with metallic multilayer detectors. It should also be straightforward to provide the 0.2T self-biasing as described in an article by S. A. Solin et al. entitled "A Self-Biasing Non-Magnetic GMR Sensor: Mercury Cadmium Telluride in Appl. Phys. Letts, vol 69 pages 4105–4107 (1996) or external biasing necessary to obtain a linear response close to H=0.

Semiconductor magnetoresistance sensors currently find widespread application in motor vehicles, for rotary speed and position sensing. Such sensors are often used in a bridge circuit, where (1/R)(dR/dH) is used as a figure of merit which typically exhibits a room temperature maximum of approximately 2.5T$^{-1}$ around a biasing field 0.25T. The EMR sensor of the present invention with $\alpha \geq 13/16$ reaches a corresponding maximum of 24 T$^{-1}$ at 0.05T, a factor of approximately 10 improvement in the figure of merit, realized at a much lower field. InSb EMR sensors should also be competitive with InSb Hall sensors now produced in quantities greater than $10^9$/year for brushless motors in consumer electronics.

A comparison of the expected performance of enhanced magnetoresistance devices with other magnetic sensors in common use is also appropriate. Such a comparison is facilitated by considering the high frequency (>100 KHz) power signal to noise ratio (SNR) where thermal noise is dominant. It can be shown that for an enhanced geometric magnetoresistance sensor and a Hall sensor of the same (homogeneous) material and approximately equivalent dimensions, $SNR_{MR}/SNR_{Hall}$ is proportional to $\mu_{app}/\mu$. Thus, the enhanced geometric MR devices according to the present invention should be superior to Hall sensors. Consider now 2-probe metallic physical GMR sensors. As $SNR_{MR}$ is proportional to $(\Delta \rho/\rho)^2 \rho$ the 2-probe advantage is partially negated by the higher MR and higher $\rho$ of the geometric MR sensor. Furthermore, physical MR information storage sensors such as spin-valve read-heads may not provide sufficient sensitivity when scaled to sizes corresponding to the superparamagnetic limit for modern media of 100 Gb/in$^2$, due to demagnetization and other magnetic effects. Composite non-magnetic semiconductors with enhanced geometric MR greater than approximately 100% at the relevant field, $H_{ref}$=0.05T are not thus limited and could still exhibit high MR even when scaled to mesoscopic sizes. Also, the response time can be approximated by the inverse of the plasmon frequency, yielding a value in the sub-picosecond range. This is significantly faster than the $10^{-9}$ to $10^{-10}$ second switching times of metallic sensors that are limited by magnetization dynamics. It should also be easy to provide the approximately 0.2T self or external biasing necessary to obtain a linear response and higher MR close to H=0.

Finally, one can readily anticipate sensors with still higher geometric EMR values. InSb thin films with higher mobilities and near vertical inhomogeneity sidewalls would yield van der Pauw sensors with substantially larger EMR. In addition, the simple van der Pauw geometry may not be optimal.

Above is a description of how the room temperature magnetoresistance of a semiconductor can be enhanced greatly in a van der Pauw disk with an embedded concentric conducting inhomogeneity, where the magnetoresistance [R(B)−R(0)]/R(0) in such a device can be greater than 100% at 500 Gauss. The EMR obtained from such a centered van der Pauw disk far exceeds that of magnetic materials such as those which exhibit Giant Magnetoresistance (GMR) or Colossal Magnetoresistance (CMR) and thus is of potential technological importance for use in magnetic sensors in a number of applications. However, creating structures with embedded metallic inhomogeneities of the type described above (e.g. a composite van der Pauw disk) represents a difficult manufacturing task especially if such a structure is to be miniaturized for applications such as a read-head sensor for use with ultra high-density magnetic recordings (~1Tb/in$^2$, where the dimension of the read head is of mesoscopic size (~300 Å). Fabricating an internal shunt at the center of a van der Pauw disc is very difficult at mesoscopic dimensions. In order to circumvent this difficulty and to greatly simplify the fabrication of EMR sensors the following is a description of a method for fabricating an EMR sensor in the form of a rectangular semiconductor plate with an external metallic inhomogeneity or shunt. Such a simplified structure has magnetotransport properties analogous to that of a composite van der Pauw disk and thus also exhibits extraordinary magnetorsistance.

Figure 4A:
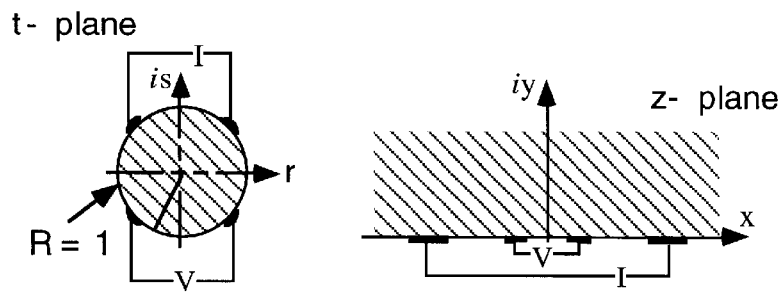
FIGS. 4A to 4E are schematic representations of van der Pauw disk—to—rectangular plate bilinear conformal mappings.
Figure 4B:
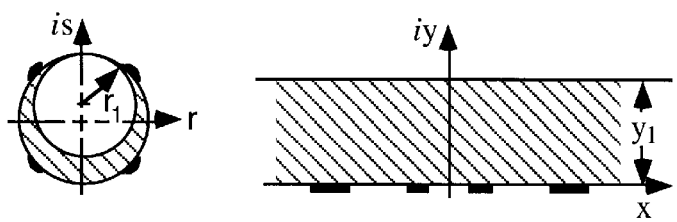
Figure 4C:
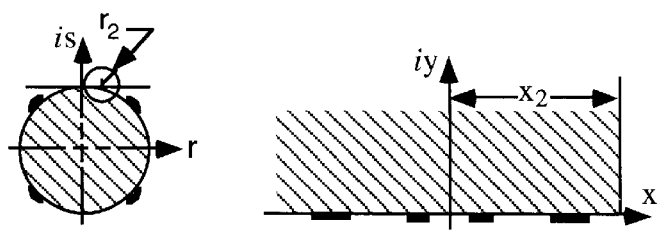
Figure 4D:
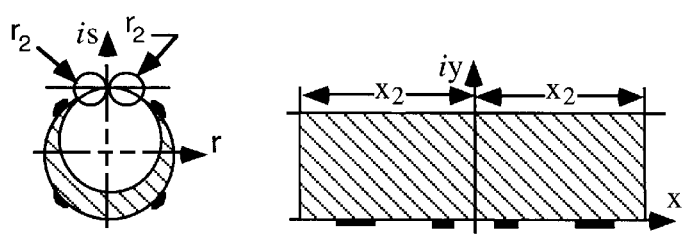

It is known that any homogeneous device with a circular boundary of unit radius in the imaginary two dimensional complex t plane with orthogonal axes r and is and t=r+is can be mapped into the complex upper half Cartesian z-plane with orthogonal axes x and iy and z=x+iy such as that also shown in FIG. 4A by using the bilinear transformation z(t)=−i{[t+i]/[t−i]}. See, R. S. Popovic, Hall Effect Devices, (Adam Hilger, Bristol, 1991). The above mapping equation transforms the four symmetrically spaced electrical contacts on the perimeter of the disk in the t-plane shown in FIG. 4A (in the configuration for a magnetoresistance measurement) into the corresponding contacts on the line y=0 in the z-plane. Although the mapped contacts are symmetric about the axis x=0, the contacts are not of equal size as they are when viewed in the t-plane. If an off-centered hole of radius $r_1$ is embedded into the homogeneous disk of FIG. 4A as shown in FIG. 4B, that hole maps into a line that truncates the upper half plane at height $y_1=1/(r_1+1)$ as shown. That is, the vacuum inside the hole of radius $r_1$ in the disk in the t-plane maps to the vacuum above the line $y_1$ in the z-plane. Consider now the circle of radius $r_2$ which creates an evacuated notch in the disk in the t-plane as shown in FIG. 4C. That circle maps into a line which truncates the z-plane at the position $x=x_2=1/r_2$ as is shown in FIG. 4C. A symmetrically displaced circle of equal radius located to the left of the vertical bisector of the disk in the t-plane truncates the z-plane with a line at position $-x_2=-(1/r_2)$ as shown in FIG. 4D. By appropriate selection of circular cuts in the t-plane, the truncated disk can be exactly mapped to a rectangular structure of a predetermined dimension in the z-plane.

Figure 4E:
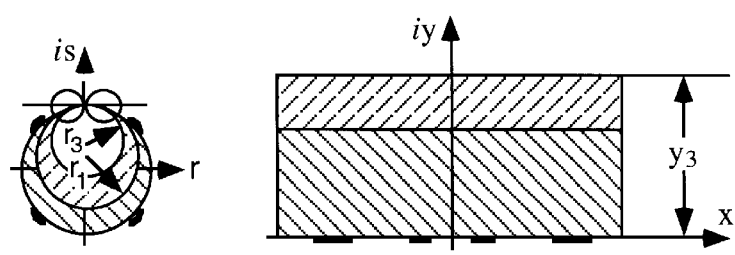

Of the structures shown in FIGS. 4A–4E, that shown in FIG. 4B which contains a fully enclosed inhomogeneity, i.e., a circular hole displaced from the center of the disk, is the simplest construction. If this hole is filled with a highly conducting metal, then the resultant structure which we refer to as an off-center van der Pauw disk is similar to the centered van der Pauw disk which yielded the large EMR values mentioned above. However, the corresponding rectangular mapped structure in the z-plane would be of infinite extent in the +x and −x directions and would contain an external metallic inhomogeneity or external shunt of infinite height in the +y direction. To avoid these complications, a new structure is defined with an additional circle of radius $r_3$ within the circle of radius $r_1$ in the t-plane as shown in FIG. 4E. The circle of radius $r_3$ maps to the line $y=y_3$ in the z-plane. If the modified off-centered van der Pauw disk is made to contain a metallic inhomogeneity embedded into the space between the circles of radii $r_1$, $r_2$, and $r_3$ while the space between the circle of radius $r_1$ and the disk perimeter contains a narrow-gap semiconductor, then the t-plane disk with an INTERNAL embedded inhomogeneity maps to a rectangle in the z-plane with a corresponding EXTERNAL metallic shunt. Moreover, for the exact mapping shown in FIG. 4E, the electrical behavior of the two structures will be identical.

Although the technique of mapping from circular coordinates into rectangular coordinates as described above is known, the adaptation of this technique to the design of extraordinary magnetoresistance devices having rectangular structures with external inhomogeneities or external shunts has not been considered by those skilled in the art. Furthermore, the electrical behavior of the rectangular structure derived from the bilinear mapping process described above will be identical to the electrical behavior of the disk structure from which the rectangular structure is derived. Moreover, starting with a disk of radius=1 (see FIG. 4A), for mapped rectangular plates with $x_2>4$, the cuts represented by the circles of radius $r_2$ (i.e., $r_2<\frac{1}{4}$) in the t-plane in FIG. 4E are small. Therefore, the externally shunted plate structure shown in the z-plane in FIG. 4E is, to a good approximation, electrically equivalent to that of the van der Pauw disk shown in FIG. 4E without the $r_2$ cuts. The calculation of the electrical properties of the structures shown in FIG. 4E is more straightforward in the rectangular coordinates of the z-plane than in the circular coordinates of the t-plane. To illustrate the advantages achieved by mapping circular EMR structures into rectangular structures the following is a solution method for the mapped rectangular plate of FIG. 4E.

Figure 5:
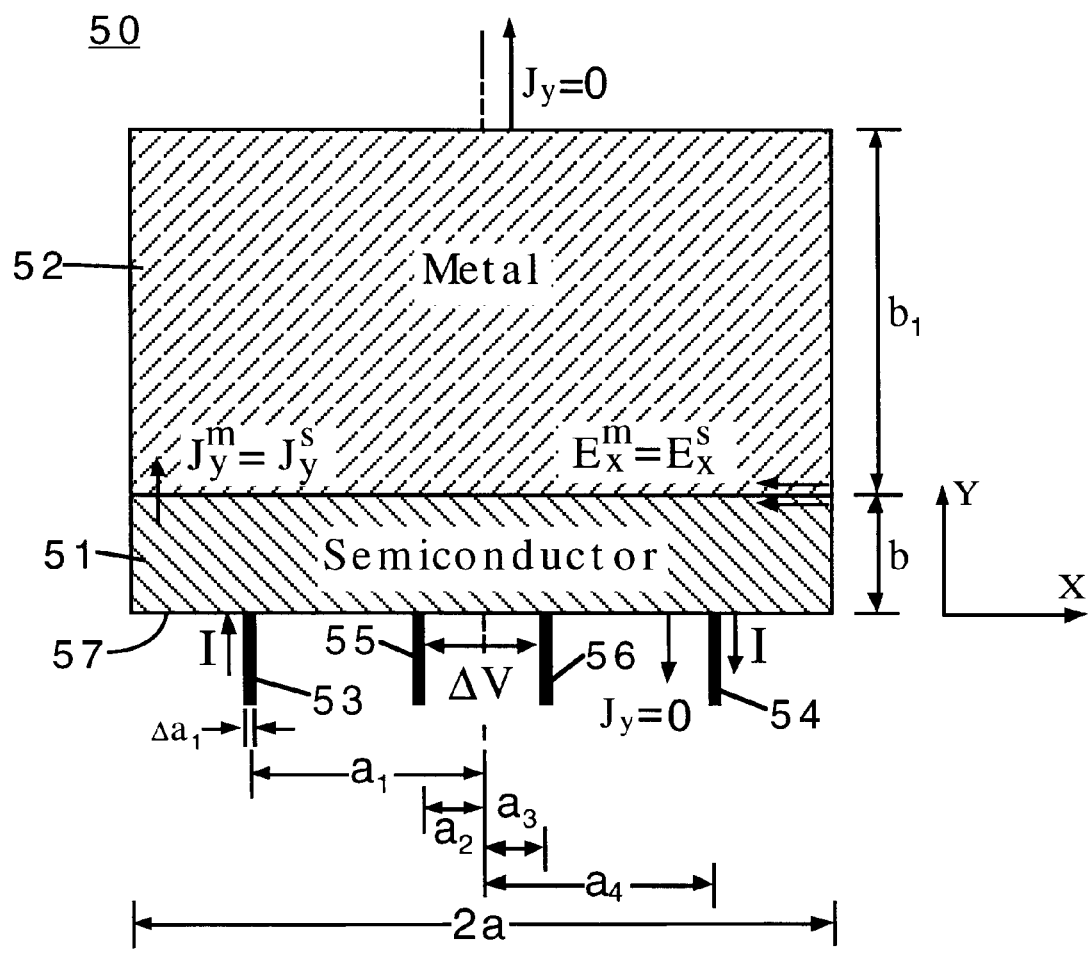
FIG. 5 is a schematic diagram of a rectangular plate construction of an EMR sensor.

The sensor shown in FIG. 5 defines the parameters of the calculation of the electromagnetic resistance of a mapped externally shunted rectangular sensor 50 which is assumed to be of uniform thickness h (in a direction normal to the plane of the figure). The length of the sensor is 2a, and the width of the semiconductor 51 and metal shunt plate 52 are b and $b_1$, respectively. As shown in FIG. 5, two current electrodes 53 and 54 are placed on the surface 57 of the semiconductor opposite the surface in contact with the plate 52, at distances to the center line of $a_1$ and $a_4$, respectively, and have widths of $\Delta a_1$ and $\Delta a_4$, respectively. Two voltage electrodes 55 and 56 are placed on the same surface 57 of the semiconductor 61 as delta function contacts of zero width at positions between the current electrodes 53 and 54 at distances to the center line of the sensor of $a_2$ and $a_3$, respectively. The voltage electrodes are considered as having zero width for calculation purposes, but the voltage electrodes have a finite width determined from lithography limitations or sensor design when actually fabricating a sensor. We define $\beta=\mu H$, $\beta_0=\mu_0 H$, where $\mu$ and $\mu_0$ are the mobilities of the semiconductor and metal, respectively and H is the applied magnetic field in a direction normal to the plane of the sensor (i.e., normal to the plane of the figure). The conductivity of the metal $\sigma_0$ ($\sigma_0=4.52\times10^7$/Ohm-m for Au) is much larger than $\sigma$, the conductivity of the semiconductor ($\sigma=1.36\times10^4$/Ohm-m for InSb).

If we assume a constant current and no accumulated charge in the device, then the Maxwell equations reduce to the Laplace equation $\partial^2 V/\partial x^2 + \partial^2 V/\partial y^2 = 0$. If it is also assumed that on the periphery of the device the current density is uniform at the location of the two current electrodes, and zero everywhere else; this defines the boundary value conditions. The boundary conditions at the semiconductor-metal interface are $E_{tangential}$ is continuous along the metal semiconductor interface and $J_{normal}$ is continuous across the interface. Finally, only the geometric contribution to the MR is considered and the physical contributions from the field dependence of the intrinsic properties of the semiconductor are ignored, e.g. $\mu$ and $\sigma$ are assumed to be H-field independent. This is a good approximation for the low field regime being considered. The problem is solved analytically without adjustable parameters, and the electrical potential V on the bottom surface 57 of the sensor as a function of $\beta$ (or equivalently as a function of magnetic field H), the dimensions of the sensor, and the position along the bottom surface 57 defined as the x-axis in a Cartesian coordinate system shown in the z-plane with its origin at the intersection of the bottom surface and center line of the sensor are calculated. Then, with $\sigma_0 >> \sigma$ and $\mu_0 << \mu$, and setting $b_1 >> b$, the result is $$V(\{P\}, \beta, x) = V_0 + \frac{(1+\beta^2)}{\sigma} \frac{2Ia}{h\Delta a_1 \pi^2} \sum_{n=1}^{\infty} \frac{1}{n^2}\left(A_n \cos\frac{n\pi x}{2a} - B_n \sin\frac{n\pi x}{2a}\right) \quad (1)$$

where $V_0$ is a constant and $\{P\}=a_1, \Delta a_1, a_2, a_3, a_4, \Delta a_4, a, b, b_1$ is the geometry parameter set $$A_n = \frac{S_n J_n + \beta S_n^2 K_n}{1+\beta^2 S_n^2}, \quad B_n = \frac{S_n K_n - \beta S_n^2 J_n}{1+\beta^2 S_n^2}, \quad S_n = \tanh\frac{n\pi b}{2a} \quad (2)$$

$$J_n = \left[\sin\frac{n\pi}{2a}(a_1+\Delta a_1) - \sin\frac{n\pi}{2a}a_1 - \sin\frac{n\pi}{2a}(a_4+\Delta a_4) + \sin\frac{n\pi}{2a}a_4\right] \quad (3)$$

and $$K_n = \left[-\cos\frac{n\pi}{2a}(a_1+\Delta a_1) + \cos\frac{n\pi}{2a}a_1 + \cos\frac{n\pi}{2a}(a_4+\Delta a_4) - \cos\frac{n\pi}{2a}a_4\right]. \quad (4)$$

Using the dependence of the electrical potential on the applied magnetic field given in Equation (1) above, it is possible to calculate the EMR of the rectangular plate as a function of the specified parameters where EMR($\{P\},\beta$)=[R($\{P\},\beta$)−$R_{min}$($\{P\},\beta$)]/$R_{min}$($\{P\},\beta$), R($\{P\},\beta$)=$\Delta V$($\{P\},\beta$)/I are the field and geometry-dependent effective resistance, I is a constant applied current, $\Delta V$ is the output voltage and $R_{min}$($\{P\},\beta$) is the minimum value of the effective resistance which may be offset from H=0 if the placement of the voltage electrodes is asymmetric. For the symmetric electrode configuration, $R_{min}$($\{P\},\beta$)=R($\{P\},0$)=$R_0$. It should be noted that the determination of the actual sheet resistance of a van der Pauw disk in general requires two voltage measurements from distinct electrode pairs. But the operational performance of a sensor is characterized by the change of the effective resistance with magnetic field so we define EMR in terms of the effective resistance. In the special case of four-fold symmetric contacts shown in FIG. 4A, the effective and actual resistances are the same and only one voltage measurement is required. In the case where $b_1 >> b$, it can be shown that the filling factor for the mapped plate is $$\alpha \cong \frac{a_4}{1+\sqrt{2}} \sqrt{1 + \frac{2a_4}{(1+\sqrt{2})b_1}} \bigg/ \left[\left(1 + \frac{a_4}{(1+\sqrt{2})b_1}\right)\left(b + \frac{a_4}{1+\sqrt{2}}\right)\right] \quad (5)$$

In order to test the above calculation and demonstrate that externally shunted rectangular structures can yield EMR of large magnitude, we fabricated a series of macroscopic devices of the type depicted schematically in FIG. 6. These devices were prepared from a 1.3 $\mu$m active layer of metal organic vapor phase epitaxy epilayer of Te-doped n-type InSb (electron concentration n=2.11×10$^{22}$ m$^{-3}$ and mobility $\mu$=4.02 m$^2$/Vs) on a 4 inch semi-insulating GaAs wafer and passivated by a 200 nm layer of Si$_3$N$_4$. The wafers were photolithographically patterned into chips bearing rectangular mesas with lateral dimensions of order 1 mm. The mesa contact pads and external shunt were simultaneously metalized with a Ti/Pt/Au stack, with Au the dominant component. Electrical contact to the electrodes of the devices was made by wire bonding.

The results of this calculation described above in Equations. (1)–(4) for both an asymmetric electrode configuration of spaced electrodes ($a_1=a_4$ and $a_2 \ne a_3$) and for a symmetric electrode configuration of equally spaced electrodes ($a_1=a4$ and $a_2=a_3$) are shown in FIGS. 6A and 6B respectively as solid lines for different plate geometries.

Figure 6A:
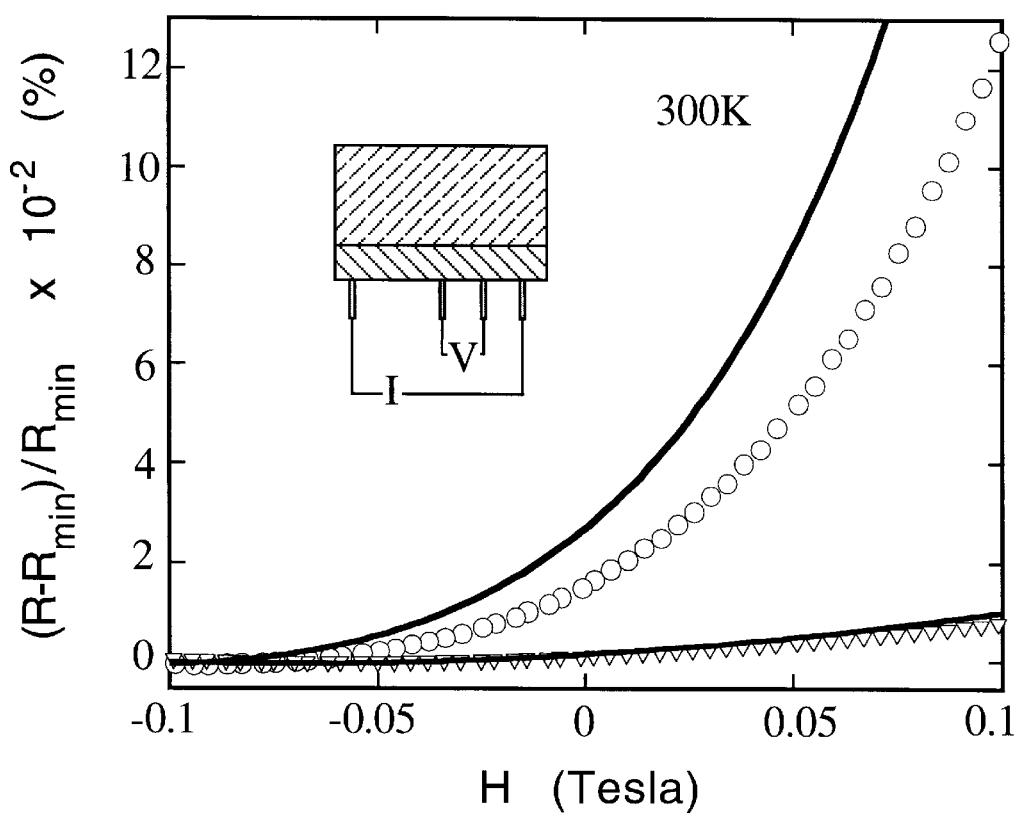
FIGS. 6A and 6B are graphical representations of the theoretical solution and measured EMR values of a mapped off-center van der Pauw disk of the corresponding sensor for two sets of sensors fabricated in accordance with the teachings of the present invention.

FIG. 6A shows a comparison of the theoretical solution (solid lines) for the EMR of a mapped off-center van der Pauw plate obtained using Equations (1)–(4) above with experimental EMR of the corresponding structure for two sets of structures with the following parameters as shown in FIG. 5: FIG. 6A, asymmetric voltage electrodes, {$a_1$=0.75 mm, $\Delta a_1$=0.01 mm, $a_2$=0 mm, $a_3$=0.35 mm, $a_4$=0.75 mm, $\Delta a_4$=0.01 mm, a=1.07 mm, $b_1$=0.9 mm} and FIG. 6B symmetric voltage electrodes, {$a_1$=0.75 mm, $\Delta a_1$=0.01 mm, $a_2$=0.35 mm, $a_3$=0.35 mm, $a_4$=0.75 mm, $\Delta a_4$=0.01 mm, a=1.07 mm, $b_1$=0.9 mm}. For both FIGS. 6A and 6B the filling factor was calculated from Equation (5) with b=0.1 mm, $\alpha$=12/16–○ while for b=0.3 mm, $\alpha$=8/16–∇.

In view of the fact that there are no adjustable parameters in the calculation and that the effect of the physical magnetoresistance is not included in the calculations but exists in the measurements, the agreement between theory and experiment is reasonable. It is possible to achieve significant room temperature EMR with externally shunted rectangular plates. The EMR of 550% obtained at 0.05 T for the plate with b/2a=1/21 (open circle in FIGS. 7A and 7B) and asymmetric voltage contacts is a factor of five higher than the corresponding maximum for the centered van der Pauw disk with symmetric contacts previously studied.

Figure 6B:
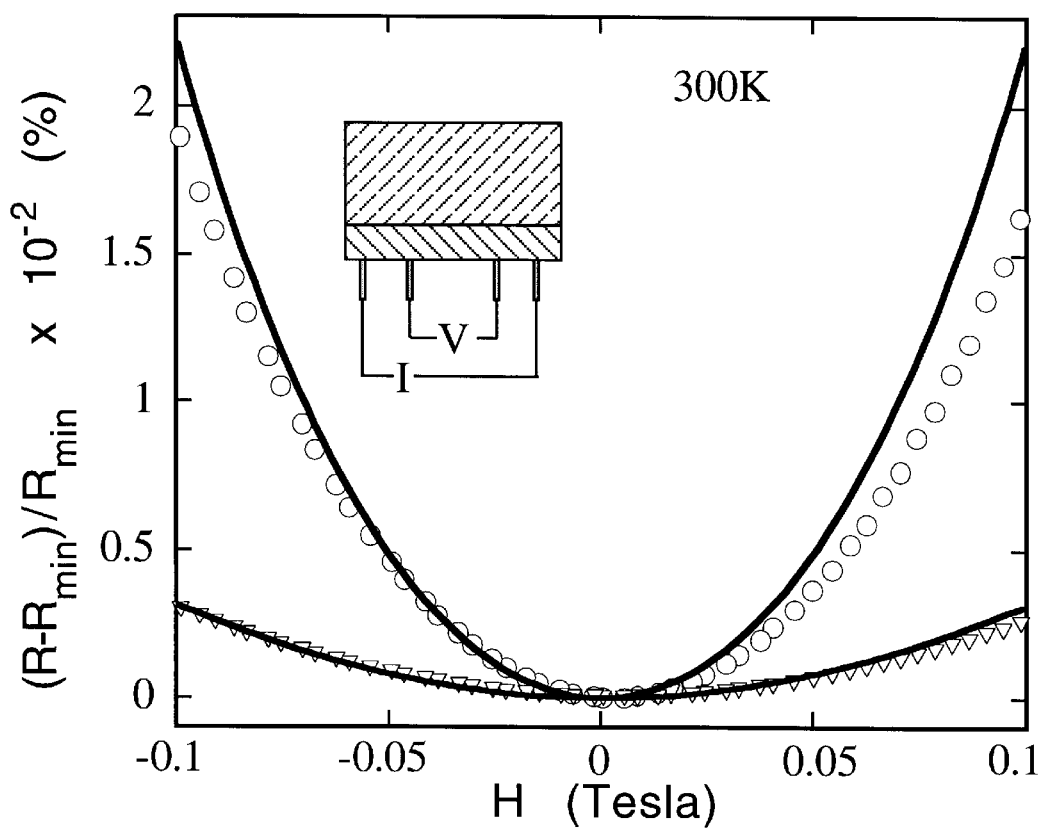

It is also evident from the data shown in FIGS. 6A and 6B that the EMR of a mapped rectangular plate is dependent upon the size, shape and location of the current and voltage electrodes. This behavior is consistent with an analysis of the solutions of the Laplace's equations with various boundary conditions. The EMR is also dependent upon the length-to-width ratio of the semiconductor plate which determines the filling factor a (see Equation (5)). For certain configurations, the EMR can be increased to more than 2,000% at 0.05T.

By analyzing the solutions to Laplace's equation with various boundary conditions, we have found that the EMR of a mapped rectangular plate with an external shunt is critically dependent upon the size, shape and location of the current and voltage contacts. For example, the calculations are in good agreement with measurements of InSb plates with Au shunts. Room temperature EMR values as high as 550% at 0.05 Tesla are obtained. The EMR is also dependent upon the length-to-width ratio of the semiconductor plate which corresponds to the filling factor $\alpha=r_a/r_b$ of the centered van der Pauw disc (where $r_a$ and $r_b$ are the radii of the disk and embedded shunt, respectively). For certain configurations, the EMR can be increased to more than 2,000% at 500 Gauss.

While the above description refers to van der Pauw disk sensors of generally circular cross-section, the invention is equally applicable to plates of various shapes, other than circular cross-section. The plates can be of any closed contour. Likewise, the inhomogeneities do not have to be cylindrical, but may be of any arbitrary shape. In the case of non-circular cross-section plates and/or non-cylindrical inhomogeneities, the dimensions of the embedded inhomogeneity in order to achieve extraordinary magnetoresistance at room temperature may be determined by considering the ratio of the area of the embedded inhomogeneity to the area of the plate.

While there have been described and illustrated several embodiments of the invention, it will be apparent to those skilled in the art that further variations and modifications are possible without deviating from the spirit and broad teachings of the present invention which shall be limited solely by the scope of the claims appended hereto.

What is claimed is:

1. A magnetoresistance van der Pauw sensor having an inhomogeneity embedded therein comprising:

a semiconductor substrate;

semiconductor material in the form of a closed contour having an area $A_a$ disposed on said substrate;

conducting material having an area $A_b$ disposed at least partially within said semiconductor material to form a conducting inhomogeneity;

whereby the ratio of the area $A_a$ to the area $A_b$ is selected to maximize the magnetoresistance of the sensor at approximately room temperature; and a stack of thin layers of metals between said semiconductor material and said conducting material for making good ohmic contact between the semiconductor material and the conducting material.

2. A magnetoresistance van der Pauw sensor as set forth in claim 1, where said semiconductor substrate is GaAs.

3. A magnetoresistance van der Pauw sensor as set forth in claim 2, where said semiconductor material has a carrier mobility greater than approximately 10,000 cm$^2$/Vsec.

4. A magnetoresistance van der Pauw sensor as set forth in claim 2, where said semiconductor material is a narrow-bandgap semiconductor.

5. A magnetoresistance van der Pauw sensor as set forth in claim 4, where said narrow-bandgap semiconductor is selected from the group consisting of indium antimonide, indium arsenide, mercury cadmium telluride, mercury zinc telluride and lead tin telluride.

6. A magnetoresistance van der Pauw sensor as set forth in claim 1, where said semiconductor material has a carrier mobility greater than approximately 10,000 cm$^2$/Vsec and its resistivity varies slowly with temperature at approximately room temperature.

7. A magnetoresistance van der Pauw sensor as set forth in claim 1, where said semiconductor material is a narrow-bandgap semiconductor.

8. A magnetoresistance van der Pauw sensor as set forth in claim 7, where said narrow-bandgap semiconductor is selected from the group consisting of indium antimonide, indium arsenide, mercury cadmium telluride, mercury zinc telluride and lead tin telluride.

9. A magnetoresistance van der Pauw sensor as set forth in claim 1, where the conductivity of said conducting material is significantly higher than that of the semiconductor material.

10. A magnetoresistance van der Pauw sensor as set forth in claim 9, where said conducting material is selected from the group consisting of silver, gold, copper, nickel, chromium and their alloys with other metals.

11. A magnetoresistance van der Pauw sensor as set forth in claim 1, where said conducting material is selected from the group consisting of silver, gold, copper, nickel, chromium and their alloys with other metals.

12. A magnetoresistance van der Pauw sensor as set forth in claim 1, where said conducting material has a thickness in the range between approximately 300 Å and 1.2 times the thickness of the semiconductor material.

13. A magnetoresistance van der Pauw sensor as set forth in claim 1, where said stack of thin layers of metals comprises Ti/Pt/Au with Au as the dominant component.

14. A magnetoresistance van der Pauw sensor as set forth in claim 1, where said substrate is GaAs, said semiconductor material is indium arsenide and said conducting material is gold.

15. A magnetoresistance van der Pauw sensor having an inhomogeneity embedded therein comprising:
    a semiconductor substrate;
    a disk of semiconductor material having a radius $r_b$ disposed on said substrate;
    cylindrical conducting material having a radius $r_a$ centrally concentrically disposed at least partially within said disk to form a conducting inhomogeneity;
    whereby $\alpha$ is the ratio of the radius $r_a$ to the radius $r_b$ and is selected to maximize the magnetoresistance of the sensor at approximately room temperature; and
    a stack of thin layers of metals between said semiconductor material and said conducting material for making good ohmic contact between the semiconductor material and the conducting material.

16. A magnetoresistance van der Pauw sensor as set forth in claim 15, where said semiconductor substrate is GaAs.

17. A magnetoresistance van der Pauw sensor as set forth in claim 16, where said semiconductor material has a carrier greater than approximately 10,000 cm$^2$/Vsec.

18. A magnetoresistance van der Pauw sensor as set forth in claim 16, where said semiconductor material is a narrow-bandgap semiconductor.

19. A magnetoresistance van der Pauw sensor as set forth in claim 18, where said narrow-bandgap semiconductor is selected from the group consisting of indium antimonide, indium arsenide, mercury cadmium telluride, mercury zinc telluride and lead tin telluride.

20. A magnetoresistance van der Pauw sensor as set forth in claim 15, where said semiconductor material has a carrier mobility greater than approximately 10,000 cm$^2$/Vsec and its resistivity varies slowly with temperature at approximately room temperature.

21. A magnetoresistance van der Pauw sensor as set forth in claim 15, where said semiconductor material is a narrow-bandgap semiconductor.

22. A magnetoresistance van der Pauw sensor as set forth in claim 21, where said narrow-bandgap semiconductor is selected from the group consisting of indium antimonide, indium arsenide, mercury cadmium telluride, mercury zinc telluride and lead tin telluride.

23. A magnetoresistance van der Pauw sensor as set forth in claim 15, where the conductivity of said conducting material is significantly higher than that of the semiconductor material.

24. A magnetoresistance van der Pauw sensor as set forth in claim 23, where said conducting material is selected from the group consisting of silver, gold, copper, nickel, chromium and their alloys with other metals.

25. A magnetoresistance van der Pauw sensor as set forth in claim 15, where said conducting material is selected from the group consisting of silver, gold, copper, nickel, chromium and their alloys with other metals.

26. A magnetoresistance van der Pauw sensor as set forth in claim 15, where the thickness of said conducting material is in the range between approximately 300 Å and 1.2 times the thickness of the semiconductor material.

27. A magnetoresistance van der Pauw sensor as set forth in claim 15, where said stack of thin layers of metals comprises Ti/Pt/Au with Au as the dominant component.

28. A magnetoresistance van der Pauw sensor as set forth in claim 15, where $\alpha$ is selected to be in the range between 10/16 and 14/16.

29. A magnetorsistance van der Pauw sensor as set forth in claim 28, where $\alpha$ is selected to be 13/16.

30. A magnetoresistance van der Pauw sensor as set forth in claim 15, where said substrate is GaAs, said semiconductor material is indium arsenide and said conducting material is gold.

31. A magnetoresistance sensor comprising:
    a plate of semiconductor material;
    a plate of conducting material in intimate contact with said plate of semiconductor material,
    where the geometry of the plates is determined from the geometry of a van der Pauw sensor by applying the bilinear transformation
    $z(t)=-i\{[t+i]/[t-i]\}$ with the van der Pauw sensor being represented in the complex t-plane with orthogonal axes r and is where t=r+ is and the resulting polygon is represented in the complex upper half Cartesian z-plane with orthogonal axes x and iy where z=x+iy,
    where said plate of semiconductor material has length 2a and width b including a pair of current electrodes extending from one surface thereof, one current electrode located at a distance $a_1$ from the center of the plate and the other current electrode at a distance $a_4$ from the center of the plate, the electrodes having width of $\Delta a_1$ and $\Delta a_4$, respectively, further including a pair of voltage electrodes extending from the one surface and located between said current electrodes, one voltage electrode located at a distance $a_2$ from the center of the plate and the other voltage electrode located at a distance $a_3$ from the center of the plate, the widths of the voltage electrode being treated, as zero for purposes of calculation but having widths of $\Delta a_2$ and $\Delta a_3$, respectively; and
    said plate of conducting material has length 2a and width $b_1$, in intimate contact with the surface opposite said one surface of said plate of semiconductor material, with the conductivity of the conducting material $\sigma_0$ being much larger than the conductivity of the semiconductor material $\sigma$,
    whereby $\mu$ and $\mu_0$ are the mobilities of the semiconductor material and the conductivity material respectively, H is the applied magnetic filed in a direction normal to the plane of the width and length of the plates, J is the current density, E is the electric field, $\beta=\mu H$, $\beta_0=\mu_0 H$, $E_{tangential}$ and $J_{normal}$ are continuous at the semiconductor-conducting material interface then if $\sigma_0 >> \sigma$, and $\mu_0 >> \mu$ and $b_1 >> b$ $$V(\{P\}, \beta, x) = V_0 + \frac{(1+\beta^2)}{\sigma} \frac{2Ia}{h\Delta a_1 \pi^2} \sum_{n=1}^{\infty} \frac{1}{n^2}\left(A_n \cos\frac{n\pi x}{2a} - B_n \sin\frac{n\pi x}{2a}\right)$$

where $V_0$ is a constant and $\{P\}=a_1, \Delta a_1, a_2, a_3, a_4, \Delta a_4, a, b, b_1$ is the geometry parameter set $$A_n = \frac{S_n J_n + \beta S_n^2 K_n}{1+\beta^2 S_n^2}, \quad B_n = \frac{S_n K_n - \beta S_n^2 J_n}{1+\beta^2 S_n^2}, \quad S_n = \tanh\frac{n\pi b}{2a}$$

$$J_n = \left[\sin\frac{n\pi}{2a}(a_1 + \Delta a_1) - \sin\frac{n\pi}{2a}a_1 - \sin\frac{n\pi}{2a}(a_4 + \Delta a_4) + \sin\frac{n\pi}{2a}a_4\right]$$

and $$K_n = \left[-\cos\frac{n\pi}{2a}(a_1 + \Delta a_1) + \cos\frac{n\pi}{2a}a_1 + \cos\frac{n\pi}{2a}(a_4 + \Delta a_4) - \cos\frac{n\pi}{2a}a_4\right]$$

thereby the extraordinary magnetoresistance of the polygonal sensor is $EMR(\{P\},\beta)=[R(\{P\},\beta)-R_{min}(\{P\},\beta)]/R_{min}(\{P\},\beta)$ where $R(\{P\},\beta)=\Delta V(\{P\},\beta)/I$ is the field and geometry-dependent effective resistance, J is a constant applied current, $\Delta V$ is the output voltage and $R_{min}(\{P\},\beta)$ is the minimum value of the effective resistance which may be offset from H=0 if the placement of the voltage electrodes is asymmetric and the filling factor $\alpha$ for the polygonal magnetoresistance sensor is $$\alpha \cong \frac{a_4}{1+\sqrt{2}} \sqrt{1 + \frac{2a_4}{(1+\sqrt{2})b_1}} \bigg/ \left[\left(1 + \frac{a_4}{(1+\sqrt{2})b_1}\right)\left(b + \frac{a_4}{1+\sqrt{2}}\right)\right].$$

32. A magnetoresistance sensor as set forth in claim 31, where said voltage electrodes are symmetrically spaced.

33. A magnetoresistance sensor as set forth in claim 31, where said voltage electrodes are asymmetrically spaced.

34. A magnetoresistance sensor comprising:
- a plate of semiconductor material of length 2a and width b including a pair of current electrodes extending from one surface thereof, one current electrode located at a distance $a_1$ from the center of the plate and the other current electrode at a distance $a_4$ from the center of the plate, the electrodes having width of $\Delta a_1$ and $\Delta a_4$, respectively, further including a pair of voltage electrodes extending from the one surface and located between said current electrodes, one voltage electrode located at a distance $a_2$ from the center of the plate and the other voltage electrode located at a distance $a_3$ from the center of the plate, the widths of the voltage electrode being treated as zero for purposes of calculation but having widths of $\Delta a_2$ and $\Delta a_3$, respectively; and
- a plate of conducting material of length 2a and width b, in intimate contact with the surface opposite said one surface of said plate of semiconductor material, with the conductivity of the conducting material $\sigma_0$ being much larger than the conductivity of the semiconductor material $\sigma$, whereby $\mu$ and $\mu_0$ are the mobilities of the semiconductor material and the conductivity material respectively, H is the applied magnetic filed in a direction normal to the plane of the width and length of the plates, J is the current density, E is the voltage, $\beta=\mu H$, $\beta_0=\mu_0 H$, $E_{tangential}$ and $J_{normal}$ at the semiconductor-conducting material interface are continuous, then if $\sigma_0 \gg \sigma$, and $\mu_0 \gg \mu$ and $b_1 \gg b$

35. A magnetoresistance sensor as set forth in claim 34, where said voltage electrodes are symmetrically spaced.

36. A magnetoresistance sensor as set forth in claim 34, where said voltage electrodes are asymmetrically spaced.

37. A polygonal magnetoresistance sensor comprising:
- a plate of semiconductor material;
- a plate of conducting material in intimate contact with said plate of semiconductor material,
- where the geometry of the plates is determined from the geometry of a van der Pauw disk sensor by applying the bilinear transformation
  $z(t)=-i\{[t+i]/[t-i]\}$ with the van der Pauw disk sensor being represented in the complex t-plane with orthogonal axes r and is where t=r+is and the resulting polygon is represented in the complex upper half Cartesian z-plane with orthogonal axes x and iy where z=x+iy,
- where said plate of semiconductor material has length 2a and width b including a pair of current electrodes extending from one surface thereof, one current electrode located at a distance $a_1$ from the center of the plate and the other current electrode at a distance $a_4$ from the center of the plate, the electrodes having width of $\Delta a_1$ and $\Delta a_4$, respectively, further including a pair of voltage electrodes extending from the one surface and located between said current electrodes, one voltage electrode located at a distance $a_2$ from the center of the plate and the other voltage electrode located at a distance $a_3$ from the center of the plate, the widths of the voltage electrode being treated as zero for purposes of calculation but having widths of $\Delta a_2$ and $\Delta a_3$, respectively; and
- said plate of conducting material has length 2a and width $b_1$, in intimate contact with the surface opposite said one surface of said plate of semiconductor material, with the conductivity of the conducting material $\sigma_0$ being much larger than the conductivity of the semiconductor material $\sigma$, whereby $\mu$ and $\mu_0$ are the mobilities of the semiconductor material and the conductivity material respectively, H is the applied magnetic filed in a direction normal to the plane of the width and length of the plates, J is the current density, E is the electric field, $\beta=\mu H$, $\beta_0=\mu_0 H$, $E_{tangential}$ and $J_{normal}$ are continuous at the semiconductor-conducting material interface then if $\sigma_0 >> \sigma$, and $\mu_0 >> \mu$ and $b_1 >> b$ $$V(\{P\}, \beta, x) = V_0 + \frac{(1+\beta^2)}{\sigma} \frac{2Ia}{h\Delta a_1 \pi^2} \sum_{n=1}^{\infty} \frac{1}{n^2}\left(A_n \cos\frac{n\pi x}{2a} - B_n \sin\frac{n\pi x}{2a}\right)$$

where $V_0$ is a constant and $\{P\}=\alpha_1, \Delta\alpha_1, \alpha_1, \alpha_2, \alpha_3, \alpha_4, \Delta\alpha_4, \alpha, b_1$ is the geometry parameter set $$A_n = \frac{S_n J_n + \beta S_n^2 K_n}{1+\beta^2 S_n^2}, \quad B_n = \frac{S_n K_n - \beta S_n^2 J_n}{1+\beta^2 S_n^2}, \quad S_n = \tanh\frac{n\pi b}{2a}$$

$$J_n = \left[\sin\frac{n\pi}{2a}(a_1+\Delta a_1) - \sin\frac{n\pi}{2a}a_1 - \sin\frac{n\pi}{2a}(a_4+\Delta a_4) + \sin\frac{n\pi}{2a}a_4\right]$$

and $$K_n = \left[-\cos\frac{n\pi}{2a}(a_1+\Delta a_1) + \cos\frac{n\pi}{2a}a_1 + \cos\frac{n\pi}{2a}(a_4+\Delta a_4) - \cos\frac{n\pi}{2a}a_4\right]$$

thereby the extraordinary magnetoresistance of the polygonal sensor is $EMR(\{P\},\beta)=[R(\{P\},\beta)-R_{min}(\{P\},\beta)]/R_{min}(\{P\},\beta)$ where $R(\{P\},\beta)=\Delta V(\{P\},\beta)/I$ is the field and geometry-dependent effective resistance, I is a constant applied current, $\Delta V$ is the output voltage and $R_{min}(\{P\},\beta)$ is the minimum value of the effective resistance which may be offset from H=0 if the placement of the voltage electrodes is asymmetric and the filling factor $\alpha$ for the polygonal magnetoresistance sensor is $$\alpha \cong \frac{a_4}{1+\sqrt{2}}\sqrt{1+\frac{2a_4}{(1+\sqrt{2})b_1}} \bigg/ \left[\left(1+\frac{a_4}{(1+\sqrt{2})b_1}\right)\left(b+\frac{a_4}{1+\sqrt{2}}\right)\right].$$

38. A magnetoresistance sensor as set forth in claim 37 where said voltage electrodes are symmetrically spaced.

39. A magnetoresistance sensor as set forth in claim 37 where said voltage electrodes are asymmetrically spaced.

40. A polygonal magnetoresistance sensor comprising:
a plate of semiconductor material of length 2a and width b including a pair of current electrodes extending from one surface thereof, one current electrode located at a distance $a_1$ from the center of the plate and the other current electrode at a distance $a_4$ from the center of the plate, the electrodes having width of $\Delta a_1$ and $\Delta a_4$, respectively, further including a pair of voltage electrodes extending from the one surface and located between said current electrodes, one voltage electrode located at a distance $a_2$ from the center of the plate and the other voltage electrode located at a distance $a_3$ from the center of the plate, the widths of the voltage electrode being treated as zero for purposes of calculation but having widths of $\Delta a_2$ and $\Delta a_3$, respectively; and
a plate of conducting material of length 2a and width $b_1$, in intimate contact with the surface opposite said one surface of said plate of semiconductor material, with the conductivity of the conducting material $\sigma_0$ being much larger than the conductivity of the semiconductor material $\sigma$, whereby $\mu$ and $\mu_0$ are the mobilities of the semiconductor material and the conductivity material respectively, H is the applied magnetic field in a direction normal to the plane of the width and length of the plates, J is the current density, E is the voltage, $\beta=\mu H$, $\beta_0=\mu_0 H$, $E_{tangential}$ and $J_{normal}$ at the semiconductor-conducting material interface is continuous, then if $\sigma_0 >> \sigma$, and $\mu_0 >> \mu$ and $b_1 >> b$ $$V(\{P\}, \beta, x) = V_0 + \frac{(1+\beta^2)}{\sigma} \frac{2Ia}{h\Delta a_1 \pi^2} \sum_{n=1}^{\infty} \frac{1}{n^2}\left(A_n \cos\frac{n\pi x}{2a} - B_n \sin\frac{n\pi x}{2a}\right)$$

where $V_0$ is a constant and $\{P\}=\alpha_1, \Delta\alpha_1, \alpha_1, \alpha_2, \alpha_3, \alpha_4, \Delta\alpha_4, \alpha, b_1$ is the geometry parameter set $$A_n = \frac{S_n J_n + \beta S_n^2 K_n}{1+\beta^2 S_n^2}, \quad B_n = \frac{S_n K_n - \beta S_n^2 J_n}{1+\beta^2 S_n^2}, \quad S_n = \tanh\frac{n\pi b}{2a}$$

$$J_n = \left[\sin\frac{n\pi}{2a}(a_1+\Delta a_1) - \sin\frac{n\pi}{2a}a_1 - \sin\frac{n\pi}{2a}(a_4+\Delta a_4) + \sin\frac{n\pi}{2a}a_4\right]$$

and $$K_n = \left[-\cos\frac{n\pi}{2a}(a_1+\Delta a_1) + \cos\frac{n\pi}{2a}a_1 + \cos\frac{n\pi}{2a}(a_4+\Delta a_4) - \cos\frac{n\pi}{2a}a_4\right]$$

thereby the extraordinary magnetoresistance of the polygonal sensor is $EMR(\{P\},\beta)=[R(\{P\},\beta)-R_{min}(\{P\},\beta)]/R_{min}(\{P\},\beta)$ where $R(\{P\},\beta)=\Delta V(\{P\},\beta)/I$ is the field and geometry-dependent effective resistance, I is a constant applied current, $\Delta V$ is the output voltage and $R_{min}(\{P\},\beta)$ is the minimum value of the effective resistance which may be offset from H=0 if the placement of the voltage electrodes is asymmetric and the filling factor, $\alpha$ for the polygonal magnetoresistance sensor is $$\alpha \cong \frac{a_4}{1+\sqrt{2}}\sqrt{1+\frac{2a_4}{(1+\sqrt{2})b_1}} \bigg/ \left[\left(1+\frac{a_4}{(1+\sqrt{2})b_1}\right)\left(b+\frac{a_4}{1+\sqrt{2}}\right)\right].$$

41. A polygonal magnetoresistance sensor as set forth in claim 40, where said voltage electrodes are symmetrically spaced.

42. A polygonal magnetoresistance sensor as set forth in claim 40, where said voltage electrodes are asymmetrically spaced.

43. A magnetoresistance sensor comprising:
a plate of semiconductor material of length 2a and width b including a pair of current electrodes extending from one surface thereof, one current electrode located at a distance $a_1$ from the center of the plate and the other current electrode at a distance $a_4$ from the center of the plate, the electrodes having width of $\Delta a_1$ and $\Delta a_4$, respectively, further including a pair of voltage electrodes extending from the one surface and located between said current electrodes, one voltage electrode located at a distance $a_2$ from the center of the plate and the other voltage electrode located at a distance $a_3$ from the center of the plate, the widths of the voltage electrode being treated as zero for purposes of calculation but having widths of $\Delta a_2$ and $\Delta a_3$, respectively; and a plate of conducting material of length 2a and width $b_1$, in intimate contact with the surface opposite said one surface of said plate of semiconductor material, with the conductivity of the conducting material $\sigma_0$ being much larger than the conductivity of the semiconductor material $\sigma$, whereby $\mu$ and $\mu_0$ are the mobilities of the semiconductor material and the conductive material respectively, H is the applied magnetic field in a direction normal to the plane of the width and length of the plates, J is the current density, E is the voltage, $\beta=\mu H$, $\beta_0=\mu_0 H$, $E_{tangential}$ and $J_{normal}$ at the semiconductor-conducting material interface are continuous, then if $\sigma_0 \gg \sigma$, and $\mu_0 \gg \mu$ and $b_1 \gg b$ $$V(\{P\}, \beta, x) = V_0 + \frac{(1+\beta^2)}{\sigma} \frac{2Ia}{h\Delta a_1 \pi^2} \sum_{n=1}^{\infty} \frac{1}{n^2} \left( A_n \cos\frac{n\pi x}{2a} - B_n \sin\frac{n\pi x}{2a} \right)$$

where $V_0$ is a constant and $\{P\} = a_1, \Delta a_1, a_2, a_3, a_4, \Delta a_4, a, b, b_1$ is the geometry parameter set $$A_n = \frac{S_n J_n + \beta S_n^2 K_n}{1 + \beta^2 S_n^2}, \quad B_n = \frac{S_n K_n - \beta S_n^2 J_n}{1 + \beta^2 S_n^2}, \quad S_n = \tanh\frac{n\pi b}{2a}$$

$$J_n = \left[ \sin\frac{n\pi}{2a}(a_1 + \Delta a_1) - \sin\frac{n\pi}{2a}a_1 - \sin\frac{n\pi}{2a}(a_4 + \Delta a_4) + \sin\frac{n\pi}{2a}a_4 \right]$$

and $$K_n = \left[ -\cos\frac{n\pi}{2a}(a_1 + \Delta a_1) + \cos\frac{n\pi}{2a}a_1 + \cos\frac{n\pi}{2a}(a_4 + \Delta a_4) - \cos\frac{n\pi}{2a}a_4 \right]$$

thereby the extraordinary magnetoresistance of the polygonal sensor is $EMR(\{P\},\beta) = [R(\{P\},\beta) - R_{min}(\{P\},\beta)]/R_{min}(\{P\},\beta)$ where $R(\{P\},\beta) = \Delta V(\{P\},\beta)/I$ is the field and geometry-dependent effective resistance, I is a constant applied current, $\Delta V$ is the output voltage and $R_{min}(\{P\},\beta)$ is the minimum value of the effective resistance which may be offset from H=0 if the placement of the voltage electrodes is asymmetric and the filling factor, $\alpha$ for the polygonal magnetoresistance sensor is $$\alpha \cong \frac{a_4}{1+\sqrt{2}} \sqrt{1 + \frac{2a_4}{(1+\sqrt{2})b_1}} \bigg/ \left[ \left(1 + \frac{a_4}{(1+\sqrt{2})b_1}\right)\left(b + \frac{a_4}{1+\sqrt{2}}\right) \right].$$

44. A magnetoresistance sensor as set forth in claim 43, where said voltage electrodes are symmetrically spaced.

45. A magnetoresistance sensor as set forth in claim 43, where said voltage electrodes are asymmetrically spaced.

* * * * *